United States Patent [19]

Debolt et al.

[11] 4,415,609
[45] Nov. 15, 1983

[54] METHOD OF APPLYING A CARBON-RICH SURFACE LAYER TO A SILICON CARBIDE FILAMENT

[75] Inventors: Harold E. Debolt, Boulder, Colo.; Raymond J. Suplinskas, Haverhill, Mass.; James A. Cornie, North Chelmsford, Mass.; Thomas W. Henze, Lawrence, Mass.; Albert W. Hauze, Chelmsford, Mass.

[73] Assignee: Avco Corporation, Wilmington, Mass.

[21] Appl. No.: 374,992

[22] Filed: May 5, 1982

Related U.S. Application Data

[62] Division of Ser. No. 173,773, Jul. 30, 1980, Pat. No. 4,340,636.

[51] Int. Cl.³ .................... C23C 11/00; C23C 13/00
[52] U.S. Cl. ................................. 427/249; 427/255.5
[58] Field of Search ............... 427/249, 255.1, 255.2, 427/255.4, 255.5, 314, 255, 402, 419.7; 428/215, 367, 368, 373, 446, 448, 698, 401

[56] References Cited

U.S. PATENT DOCUMENTS

| 3,382,113 | 5/1968 | Ebert et al. | 427/249 |
| 3,386,866 | 6/1968 | Ebert et al. | 427/249 |
| 3,577,285 | 5/1971 | Rutz | 427/249 |
| 4,068,037 | 1/1978 | Debolt et al. | 427/249 |
| 4,194,028 | 3/1980 | Sirtl et al. | 427/249 |

Primary Examiner—S. L. Childs
Attorney, Agent, or Firm—Abraham Ogman

[57] ABSTRACT

The invention relates to a surface treatment for stoichiometric silicon carbide. A carbon-rich silicon carbide layer is applied over the silicon carbide. In the case of the silicon carbide surface, the ratio of silicon to carbon in the carbon-rich layer varies from one at the silicon carbide interface to near zero in the interior of the carbon-rich layer to greater than zero and preferably 0.3 to 0.5 on the surface of the carbon-rich layer remote from the interface. A preferred method of making the silicon carbide layer is also presented.

5 Claims, 3 Drawing Figures

METHOD OF APPLYING A CARBON-RICH SURFACE LAYER TO A SILICON CARBIDE FILAMENT

This invention is licensed to the U.S. Government under Contract No. N00014-79-C-0349 with the U.S. Air Force.

This is a division of application Ser. No. 173,773 filed July 30, 1980, now U.S. Pat. No. 4,340,636.

BACKGROUND OF THE INVENTION

Unless otherwise qualified, silicon carbide shall mean stoichiometric silicon carbide.

Carbon-rich silicon carbide shall mean deposits in which the ratio of silicon to carbon shall be in the range of 0+ to 1.

High-strength and/or high-modulus filaments or strips shall mean structures having a tensile strength of 300 ksi or greater and a tensile modulus of 40,000 ksi or greater.

The present invention is applicable to silicon carbide and carbon surfaces of all shapes and sizes. It is particularly important for filaments, thin strips, and the like. The following discussion will be directed to filaments as a typical example.

Composite materials in plastic or metal matrices reinforced with high-strength, high-modulus filaments such as boron and silicon carbide are finding increased popularity in structural applications. In particular these types of composites are useful where high-strength and stiffness with accompanying low weight is desired.

The present state-of-the-art silicon carbide filament or thin strip contains a refractory core, generally tungsten or carbon. The core may include an intermediate buffer zone followed by a relatively thick layer of silicon carbide. In general the silicon carbide and buffer zone are made by means of hydrogen reduction and chemical vapor deposition processes wherein gases containing silicon and carbon are decomposed and deposited on the core. The thickness of the silicon carbide coating is directly related to the deposition time and temperature.

An important use of said silicon carbide coatings is in connection with high-strength, high-modulus silicon carbide filaments of the type described in U.S. Pat. No. 4,068,037. In this patent there is described a silicon carbide filament formed on a carbonaceous core. In other applications the silicon carbide coating is deposited on a tungsten core.

The aforementioned referenced patent, U.S. Pat. No. 4,068,037, is the closest art known to Applicants in relation to the present invention. The filament described in the referenced patent represents the state of the art. In particular, it will be noted that the filament described in the patent contains a carbon-rich silicon carbide outer coating which is important for maintaining overall filament strength and stiffness. However, this outer coating makes it very difficult to incorporate these filaments within metal matrices such as aluminum, titanium, as well as epoxy matrices because the matrix material does not bond well to the carbon-rich outer layer.

The outer carbon-rich silicon carbide layer of the state-of-the-art silicon carbide filament discussed above has been physically characterized as a layer where the ratio of silicon to carbon varies from one at the interface of the carbon-rich layer with the stoichiometric silicon carbide layer to zero at the exterior surface of the filament. In other words, the exterior surface of the carbon-rich layer is essentially pure carbon.

The industry has long known that it is extremely difficult to incorporate carbon filaments within plastic and metal matrices. Carbon is, in one instance, highly reactive. Prior attempts to incorporate such state-of-the-art silicon carbide filaments containing carbon surfaces and/or carbon filaments within aluminum or titanium matrices by hot-molding have been less than desired. In most cases the resulting composite is not very strong because the molding process has greatly weakened the filaments. Additionally, carbon is not readily wet by aluminum or titanium, and even the common plastic matrices such as epoxys. As a result, composite properties suffer.

The difference in properties of the filament in composites between the heretofore state-of-the-art practice and the practice enumerated in this application will become readily apparent with reference to the chart that is provided herein.

It is an object of the invention to provide a surface treatment for stoichiometric silicon carbide which enhances the wetting capability of the silicon carbide without deleterious effects on the strength of said silicon carbide.

It is another object of the invention to provide a surface treatment for carbon which also enhances its wetting capability without deleterious effects on its strength.

It is yet another object of the invention to provide a method of making a high-strength, high-modulus silicon carbide filament.

In accordance with the invention, there is provided a surface treatment for stoichiometric silicon carbide and/or carbon comprising a carbon-rich silicon carbide layer overcoating the stoichiometric silicon carbide or carbon. The ratio of silicon to carbon of the carbon-rich layer varies from one at the interface with stoichiometric silicon carbide to near zero at the interior to a value substantially greater than zero at the surface remote from said interface. The carbon rich silicon carbide treatment for carbon surface has a silicon to carbon ratio of zero at the carbon surface to a value greater than zero in the remote surface.

It is hypothesized that silicon carbide is particularly sensitive to the presence of non-stoichiometric silicon carbide or impurities. I. T. Kendall, *Journal of Chemical Physics*, Vol. 21, pg. 821 (1953). Since both Kendall and K. Arnt & E. Hausmanne in *Zeits Anorg Chem.*, Vol. 215, pg. 66 (1933) have found no evidence of non-stoichiometric silicon carbide, it is hypothesized that the excess carbon appears in the silicon carbide as an impurity. The properties of silicon carbide are particularly sensitive to the presence of impurities such as carbon.

Though the precise strength of carbon-rich silicon carbide may not be known with certainty, regions where quantitatively there is an excess of carbon have been observed.

The novel features that are considered characteristic of the invention are set forth in the appended claims; the invention itself, however, both as to its organization and method of operation, together with additional objects and advantages thereof, will best be understood from the following description of a specific embodiment, when read in conjunction with the accompanying drawings, in which:

DESCRIPTION OF THE INVENTION

This invention will be described within the context of making silicon carbide filament. The invention is operative, irrespective of the structure and composition of the core used to make the filament. In addition, the invention has particular application to very thin strips of silicon carbide and/or carbon where it is desired to preserve the high-strength and high-modulus properties of thin strips.

Figure 1:
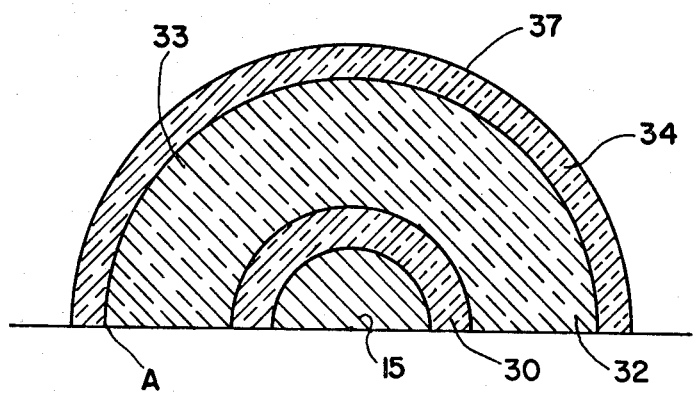
FIG. 1 is a cross-sectional representation of silicon carbide filament embodying the principals of the present invention.

Referring to FIG. 1, there is shown a cross section of a silicon carbide filament embodying the principals of the present invention. More particularly, the filament contains a core 15 which may be tungsten, carbon, etc. In accordance with the teachings of U.S. Pat. No. 4,068,037, the FIG. 1 filament contains a carbon-rich buffer layer 30 on which a stoichiometric silicon carbon deposit 32 is provided. In the event the core 15 is a carbonaceous core, it is sometimes desirable to include a thin layer of pyrolitic graphite (not shown) between the core 15 and the carbon-rich layer 30.

The silicon carbide filament in FIG. 1 includes a surface deposit 34 of carbon-rich silicon carbide in accordance with the teachings of this invention. The cross section of the carbon-rich deposit 34 does not contain a uniform composition. The silicon to carbon ratio across the cross section of deposit 34 varies essentially radially in the case of this type of filament. The particular variation is shown in the Auger profile in FIG. 2.

Figure 2:
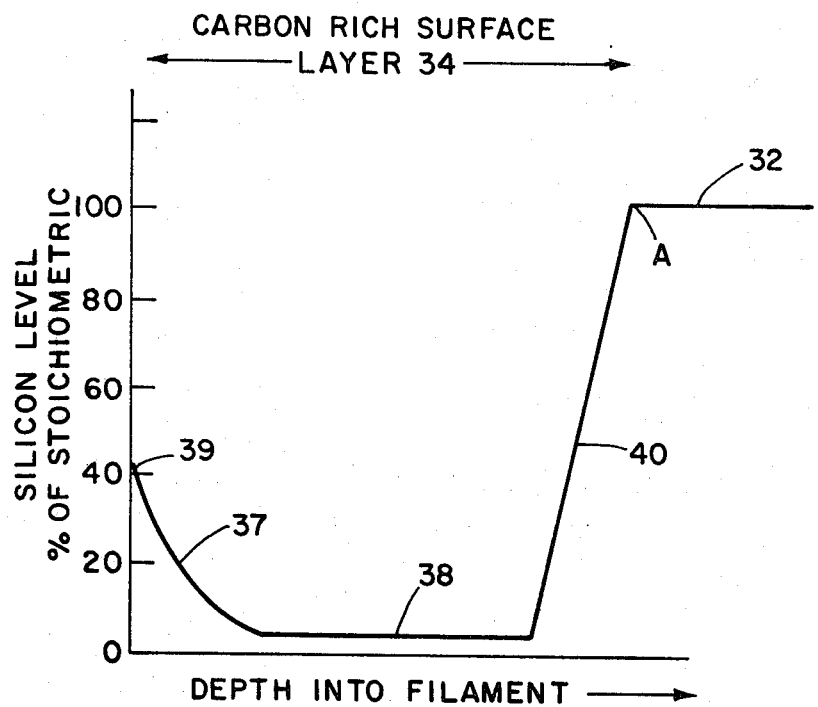
FIG. 2 is a curve which is useful in describing the invention.

FIG. 2 is an Auger profile of the carbon-rich surface deposit 34. The composition of the surface deposit 34 is not uniform. Three regions 37, 38 and 40 are apparent. At the surface 39 of region 37, the ratio of silicon to carbon is shown as 0.4 or 40%. The ratio of silicon to carbon in this region 37 drops rapidly away from the surface 39 and merges with a near pure carbon region 38. The ratio of silicon to carbon then rises almost precipitously in region 40 until it achieves stoichiometric proportion at the interface between the layers 34 and deposit 32 at point A.

The silicon content is generally combined with carbon to form SiC in the carbon-rich surface layer. Some free silicon may exist however without detriment as aluminum and titanium matrices, in particular, wet silicon.

The overall depth of the carbon-rich surface layer 34 is from 0.7 to 1.3 microns. The depth of region 37 is about 0.25 microns±20%, while the depth of region 38 is about 0.5 microns. A minimum of 0.15 microns depth is recommended for region 40. Clearly, some variation in depth is permitted.

A worktable ratio at the surface 39 is in the range of 0.3 to 0.5. This is not necessarily the optimum range. However, experimental data indicates that between 0.3 and 0.5 a commercially viable filament results. In a broad sense it is believed that any ratio more than zero will perform satisfactorily either from a strength point of view or a wetting point of view, or both.

Figure 3:
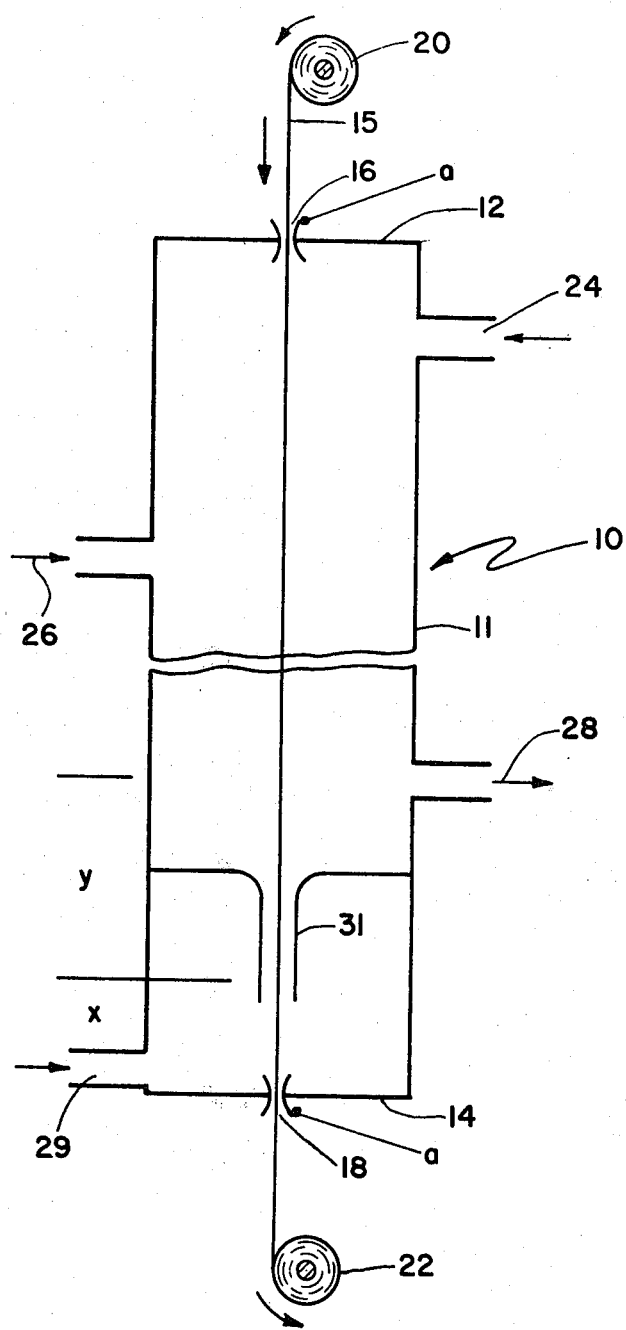
FIG. 3 is a schematic representation of a reactor for making silicon carbide filament.

The preferred method of making a silicon carbide is by means of a vapor deposition process. In FIG. 3 of the drawings, there is shown schematically a reactor 10 which comprises a generally closed tubular cylinder 11 containing a pair of oppositely disposed closed ends 12 and 14. Central apertures containing mercury contacts 16 and 18 are defined in each of the ends 12 and 14. The mercury contacts are coupled through terminals a—a to a source of electrical power not otherwise shown. The core 15 is obtained from a supply reel 20. The core 15 passes into the cylinder 11 into the mercury contact 16 and out of the cylinder 11 through the mercury contact 18 to a take-up reel 22. Briefly, the core 15 is raised to a deposition temperature by means of electrical resistance heating through terminals a—a in a conventional way.

A number of ports through which gas is fed to the cylinder 11 or exhausted from cylinder 11 are provided. The process for making a state-of-the-art silicon carbide filament shown in FIG. 1 is fully described in U.S. Pat. No. 4,068,037, and such teaching is incorporated by reference herein. Typically, at the top of the reactor at port 24, a silane blend, hydrogen, argon, and propane are fed to the reactor in quantities to deposit on the core 15 the carbon-rich silicon carbide layer 30. Additional silane blend and hydrogen are added to dilute the mixture of gases in contact with the core 15 through the port 26. The mixture of gases is exhausted through port 28. Between ports 26 and 28 the silicon carbide deposit 33 is formed. The carbon-rich surface deposit 34 is produced by introducing argon, a silane gas, and propane through port 29. These gases are also exhausted through port 28. A baffle 31 may be provided to insure that the gases introduced in port 29 make contact with the filament; it is not a required structure. The preferred composition of the blend entering port 29 is 4 parts argon, 1 part propane and 0.02 parts dichlorosilane.

The silane gas is highly reactive relative to the propane so that it decomposes and deposits a carbon-rich silicon carbide deposit on the SiC 32 adjacent to the port 29. For purposes of illustration, we will assume that the silane gas decomposes in the region identified by the symbol x. Since the propane is less reactive than the silane, it will decompose further up the reactor, and for purposes of illustration, we will assume that the propane decomposes in the range y.

Thus as the filament moves from the supply reel 20 toward the take-up reel 22, it reaches the propane deposition region y first, and there is deposited on the surface of the filament at this point a carbon-rich deposit where the silicon to carbon ratio varies from one to essentially zero. As the filament enters the region x where the silanes are decomposing, the ratio of silicon carbide increases from essentially zero to a value greater than zero as discussed above. The deposition conditions in this lower end of the reactor are similar to those set out in the patent referenced above.

Clearly, in the event the surface treatment is to be applied to a carbon surface, it is merely necessary to provide a silane-rich region, such as x, noted to encourage a deposit where the ratio of silicon to carbon exceeds zero.

Current experimental data indicates that a workable silicon to carbon ratio at the exterior surface 39 is in the range of 0.3 to 0.5 with 0.4 exhibiting adequate results. It is clear that these are not necessarily the optimum results. There is no reason to believe that the silicon to carbon ratio at the exterior surface 39 cannot increase or decrease from the presently known workable range.

Representative properties of the heretofore state-of-the-art filament and composites in comparison with similar properties of the new filament are provided in the chart below.

|  | PROPERTIES | |
| --- | --- | --- |
|  | Prior Art | New |
| Filament Tensile Strength | 560–600 ksi (scatter) | 720 ksi average |
| Surface Strength (Loop Dia) | 8–10 mm | 8–10 mm |
| Castable | No - 60–80 ksi | Greater than 200 ksi |
| Diffusion-bonding - 5000 psi | <200 ksi; 30 min. cycle | Greater than 200 ksi; 30 min. cycle |
| Hot-molding - 400–800 psi | No consolidation | Greater than 200 ksi |
| Dipped in molten aluminum 1250F | Degradation after 15 min. | 3 hrs. - no degradation |
| Dipped in molten aluminum 1400F | Degradation after 5 min. | 30–60 min. - no degradation |

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims:

We claim:

1. A method of applying a carbon-rich surface layer to a silicon carbide filament comprising:
   supplying an elongated reactor through which a filament substrate moves, said reactor having an entrance port through which a hydrocarbon and silane mixture is supplied to vapor deposit stoichiometric silicon carbide on the substrate filament;
   an intermediate exit port for removing said mixture;
   a lower entrance port below said intermediate exit port through which a hydrocarbon and silane blend is supplied to flow counter to the movement of the filament to the exit port; and
   adjusting the vapor deposition rates of the hydrocarbon and silane blend so that the percentage of unreacted silane in the blend relative to unreacted hydrocarbon decreases as the blend moves from the lower entrance port to the exit port.

2. A process as described in claim 1 where the Si/C ratio at the surface of the carbon-rich surface layer is 0.3 to 0.5.

3. A process as described in claim 1 where the depth of the carbon-rich surface layer is from 0.7 to 1.3 microns.

4. A process as described in claim 1 where the blend of hydrocarbon to silane is 4 parts argon, 1 part propane and 0.02 parts dichlorosilane.

5. A process as described in claim 1 where the hydrocarbon is propane and the silane is dichlorosilane.

* * * * *

UNITED STATES PATENT AND TRADEMARK OFFICE
CERTIFICATE OF CORRECTION

PATENT NO. : 4,415,609

DATED : November 15, 1983

INVENTOR(S) : Harold E. DeBolt et al

It is certified that error appears in the above-identified patent and that said Letters Patent are hereby corrected as shown below:

Column 2, line 55, please change "strength" to --structure--.

Column 4, line 30, please change "33" to --32--.

Signed and Sealed this

Seventh Day of February 1984

[SEAL]

Attest:

GERALD J. MOSSINGHOFF

Attesting Officer     Commissioner of Patents and Trademarks